United States Patent
Hao et al.

(10) Patent No.: US 9,791,960 B2
(45) Date of Patent: Oct. 17, 2017

(54) OLED TOUCH CONTROL DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Peng Hao, Guangdong (CN); Xianjie Li, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 64 days.

(21) Appl. No.: 14/428,974

(22) PCT Filed: Feb. 9, 2015

(86) PCT No.: PCT/CN2015/072507
§ 371 (c)(1),
(2) Date: Mar. 17, 2015

(87) PCT Pub. No.: WO2016/086540
PCT Pub. Date: Jun. 9, 2016

(65) Prior Publication Data
US 2016/0162096 A1      Jun. 9, 2016

(30) Foreign Application Priority Data

Dec. 4, 2014   (CN) .......................... 2014 1 0734964

(51) Int. Cl.
*G06F 3/045*      (2006.01)
*G06F 3/041*      (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC . G06F 2203/04103; G06F 2203/04804; G06F 3/0412; G06F 3/0416; G06F 3/044;
(Continued)

(56) References Cited

U.S. PATENT DOCUMENTS

| 2004/0080267 A1* | 4/2004 | Cok ...................... G06F 3/0412 313/512 |
| 2010/0007616 A1* | 1/2010 | Jang ...................... G06F 3/0412 345/173 |

(Continued)

FOREIGN PATENT DOCUMENTS

| CN | 1738495 A | 2/2006 |
| CN | 102033646 A | 4/2011 |
| CN | 102566837 A | 7/2012 |

*Primary Examiner* — Insa Sadio
(74) *Attorney, Agent, or Firm* — Andrew C. Cheng (57) ABSTRACT

The present invention provides an OLED touch control display device and a manufacture method thereof, comprising: an OLED display (1) and a transparent touch panel (2); the OLED display (1) comprises: a substrate (11), a transparent package cover plate (12), first electrode layers (13), an organic emitting light layer (14) and a second electrode layer (15); the first electrode layer (13) is a reflective electrode, and the second electrode layer (15) is a transparent electrode; the transparent touch panel (2) is located at a side of the transparent package cover plate (12) of the OLED display (1) backing to the substrate (11). The OLED touch control display device can allow the top emitting OLED to possess touch control function to prevent the influence of the finger touch to the display result, and to diminish the thickness of the touch control display device and reduce the production cost.

7 Claims, 5 Drawing Sheets

(51) Int. Cl.
    *G06F 3/044*     (2006.01)
    *G09G 3/3216*     (2016.01)
    *G09G 3/3225*     (2016.01)
    *H01L 27/32*     (2006.01)

(52) U.S. Cl.
    CPC ......... *G09G 3/3216* (2013.01); *G09G 3/3225* (2013.01); *H01L 27/323* (2013.01); *H01L 27/3248* (2013.01); *H01L 27/3258* (2013.01); *H01L 27/3262* (2013.01); *H01L 27/3276* (2013.01); *G06F 2203/04103* (2013.01); *G06F 2203/04804* (2013.01)

(58) Field of Classification Search
    CPC .. G09G 3/3216; G09G 3/3225; H01L 27/323; H01L 27/3248; H01L 27/3258; H01L 27/3262; H01L 27/3276
    See application file for complete search history.

(56) References Cited

U.S. PATENT DOCUMENTS

2011/0080372 A1*   4/2011   Lee ..................... G06F 3/045
                                                              345/174
2014/0293143 A1*  10/2014   Yang .................. G06F 1/1643
                                                              349/12

\* cited by examiner

OLED TOUCH CONTROL DISPLAY DEVICE AND MANUFACTURE METHOD THEREOF

FIELD OF THE INVENTION

The present invention relates to a touch control display technology field, and more particularly to an OLED touch control display device and a manufacture method thereof.

BACKGROUND OF THE INVENTION

In the display skill field, the Liquid Crystal Display (LCD), the Organic Light Emitting Diode (OLED) and other panel displays have gradually replaced the CRT displays.

At present, the main stream LCD display panel is formed by laminating a TFT Array Substrate (Thin Film Transistor Array Substrate) and a CF (Color Filter), and Liquid Crystal is injected between the TFT substrate and the CF substrate. The light of backlight module is reflected to generate images by applying driving voltages to control whether the directions of the liquid crystal molecules to be changed.

The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display.

The OLED can be categorized into two major types according to the driving methods, which are the Passive Matrix (PM) OLED and the Active Matrix (AM) OLED, i.e. the direct addressing and the Thin Film Transistor (TFT) matrix addressing.

With the development of portable electronic display devices, the touch panel provides a new human machine interactive interface. The usage is more direct and with more humanization. Forming a touch control display device with combining the touch panel and the flat display device is capable of providing the touch control function to the flat display device. With the fingers, the stylus for inputting, the operation can be more intuitive and easier. The touch panel technology can be categorized into resistance-type, capacitance-type, infrared ray, surface wave, etc., wherein the induction capacitance-type and the four wires resistance-type are more applied at present.

Figure 1:
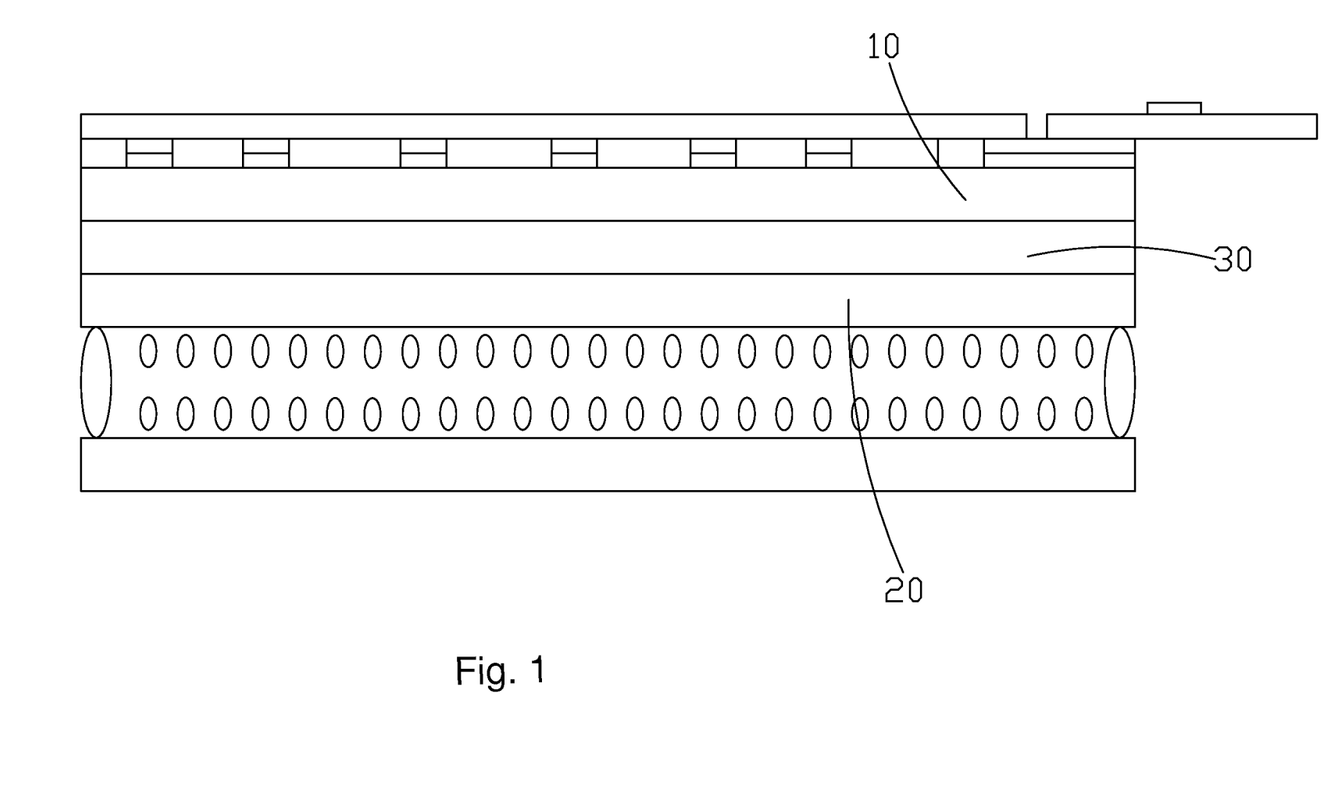
FIG. 1 is a structural diagram of a LCD touch control display device according to prior art.

As shown in FIG. 1, in the present touch panel function integrated LCD touch control display device, the touch panel 10 is an independent element conjunct on the LCD 20, such as a Capacitive Touch Panel (CTP). Meanwhile, for preventing that the LCD 20 beneath the touch panel 10 is pressed as the finger touches, and the cell gap of the liquid crystal layer is changed, and then to influence the display result, when manufacturing the LCD touch control display device, the clearance 30 of certain distance is maintained between the touch panel 10 and the LCD 20. Consequently, it leads to that the thickness of the LCD touch control display device is over larger and the production cost is higher.

Apparently, as the touch panel and the LCD are integrated to be the LCD touch control display device, the press of the finger to the panel can cause the change of the cell gap of the liquid crystal layer, and directly influence the display result. However, with the all solid state property of the OLED display element, such problem can be absolutely erased as integrating with the touch panel, and the manufacture process can be simplified.

SUMMARY OF THE INVENTION

An objective of the present invention is to provide an OLED touch control display device, allowing the top emitting OLED to possess touch control function to prevent the influence of the finger touch to the display result, and to diminish the thickness of the touch control display device and reduce the production cost.

Another objective of the present invention is to provide a manufacture method of an OLED touch control display device, and the OLED touch control display device manufactured by the method can allow the top emitting OLED to possess touch control function to prevent the influence of the finger touch to the display result, and to diminish the thickness of the touch control display device and reduce the production cost.

For realizing the aforesaid objective, the present invention provides an OLED touch control display device, comprising: an OLED display and a transparent touch panel;

the OLED display comprises: a substrate, a transparent package cover plate oppositely located with the substrate, first electrode layers formed at a side of the substrate facing the transparent package cover plate and arranged in array, an organic emitting light layer and a second electrode layer located on a surface of each first electrode layer away from the substrate;

the first electrode layer is a reflective electrode, and the second electrode layer is a transparent electrode;

the transparent touch panel is located at a side of the transparent package cover plate of the OLED display backing to the substrate.

The transparent touch panel comprises: a transparent electrode conductive layer formed on the transparent package cover plate, and the electrode conductive layer comprises at least two unit electrodes, a first insulative layer at junctions of the unit electrodes, an auxiliary electrode connected to the unit electrode and a touch drive circuit electrically connected to the auxiliary electrode.

The OLED display is a Passive Matrix OLED, and the Passive Matrix OLED further comprises a second insulative layer and an isolation column stacked and located between the two first electrode layers and a display drive circuit electrically connected to the first electrode layers.

The OLED display is an Active Matrix OLED, and the Active Matrix OLED further comprises: TFTs located at the side of the substrate facing the transparent package cover plate and arranged in array, and each TFT is connected to one first electrode layer, and a third insulative layer is located between two adjacent TFTs and a display drive circuit electrically connected to the TFTs.

The OLED touch control display device further comprises a polarizer located on the transparent touch panel and a scratch resistant transparent hard film located on the polarizer.

The present invention further provides a manufacture method of an OLED touch control display device, comprising steps of:

step 1, providing a substrate, and forming a top emitting OLED display element at a side of the substrate;

step 2, providing a transparent package cover plate, and bonding the substrate and the transparent package cover plate with packaging adhesive for employing the transparent package cover plate to package the OLED display element;

step 3, forming a transparent touch panel at a side of the transparent package cover plate backing to the substrate.

The step 1 comprises:

step 11, forming a first electrode layer of the OLED display element at the side of substrate, and electrically connecting the first electrode layer and a display driving circuit;

the first electrode layer is a reflective electrode;

step 12, forming a second insulative layer and an isolation column stacked between the two first electrode layers;

step 13, sequentially forming an organic emitting light layer and a second electrode layer on a surface of each first electrode layer away from the substrate;

the second electrode layer is a transparent electrode.

The step 1 comprises:

step 11', forming TFTs at the side of the substrate and arranged in array, and forming a third insulative layer between two adjacent TFTs and electrically connecting a display drive circuit to the TFTs.

step 12', forming a first electrode layer connected to each TFT at the side of the substrate where the TFTs are arranged in array;

the first electrode layer is a reflective electrode;

step 13', sequentially forming an organic emitting light layer and a second electrode layer on a surface of each first electrode layer away from the substrate;

the second electrode layer is a transparent electrode.

The step 3 comprises:

step 31, forming a transparent electrode conductive layer comprising at least two unit electrodes at the side of the transparent package cover plate backing to the substrate;

step 32, forming a first insulative layer at junctions of the unit electrodes;

step 33, forming an auxiliary electrode connected to the unit electrode and electrically connecting the auxiliary electrode and a touch drive circuit.

The step 3 further comprises: step 34, locating a polarizer on the transparent touch panel and locating a scratch resistant transparent hard film located on the polarizer.

The present invention further provides an OLED touch control display device, comprising: an OLED display and a transparent touch panel;

the OLED display comprises: a substrate, a transparent package cover plate oppositely located with the substrate, first electrode layers formed at a side of the substrate facing the transparent package cover plate and arranged in array, an organic emitting light layer and a second electrode layer located on a surface of each first electrode layer away from the substrate;

the first electrode layer is a reflective electrode, and the second electrode layer is a transparent electrode;

the transparent touch panel is located at a side of the transparent package cover plate of the OLED display backing to the substrate;

wherein the transparent touch panel comprises: a transparent electrode conductive layer formed on the transparent package cover plate, and the electrode conductive layer comprises at least two unit electrodes, a first insulative layer at junctions of the unit electrodes, an auxiliary electrode connected to the unit electrode and a touch drive circuit electrically connected to the auxiliary electrode;

wherein the OLED display is a Passive Matrix OLED, and the Passive

Matrix OLED further comprises a second insulative layer and an isolation column stacked and located between the two first electrode layers and a display drive circuit electrically connected to the first electrode layers.

The benefits of the present invention are: the OLED touch control display device and the manufacture method thereof provided by the present invention sets the first electrode layer close to the substrate to be the reflective electrode and sets the second electrode layer away from the substrate to be the transparent electrode, and locates the transparent touch panel at the side of the transparent package cover plate backing to the substrate, to make the top emitting OLED possess touch control function, and the all solid state property of the OLED display element is utilized to prevent the influence of the finger touch to the display result; compared with the LCD touch control display device, the thickness of the touch control display device can be diminished and the production cost can be reduced.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
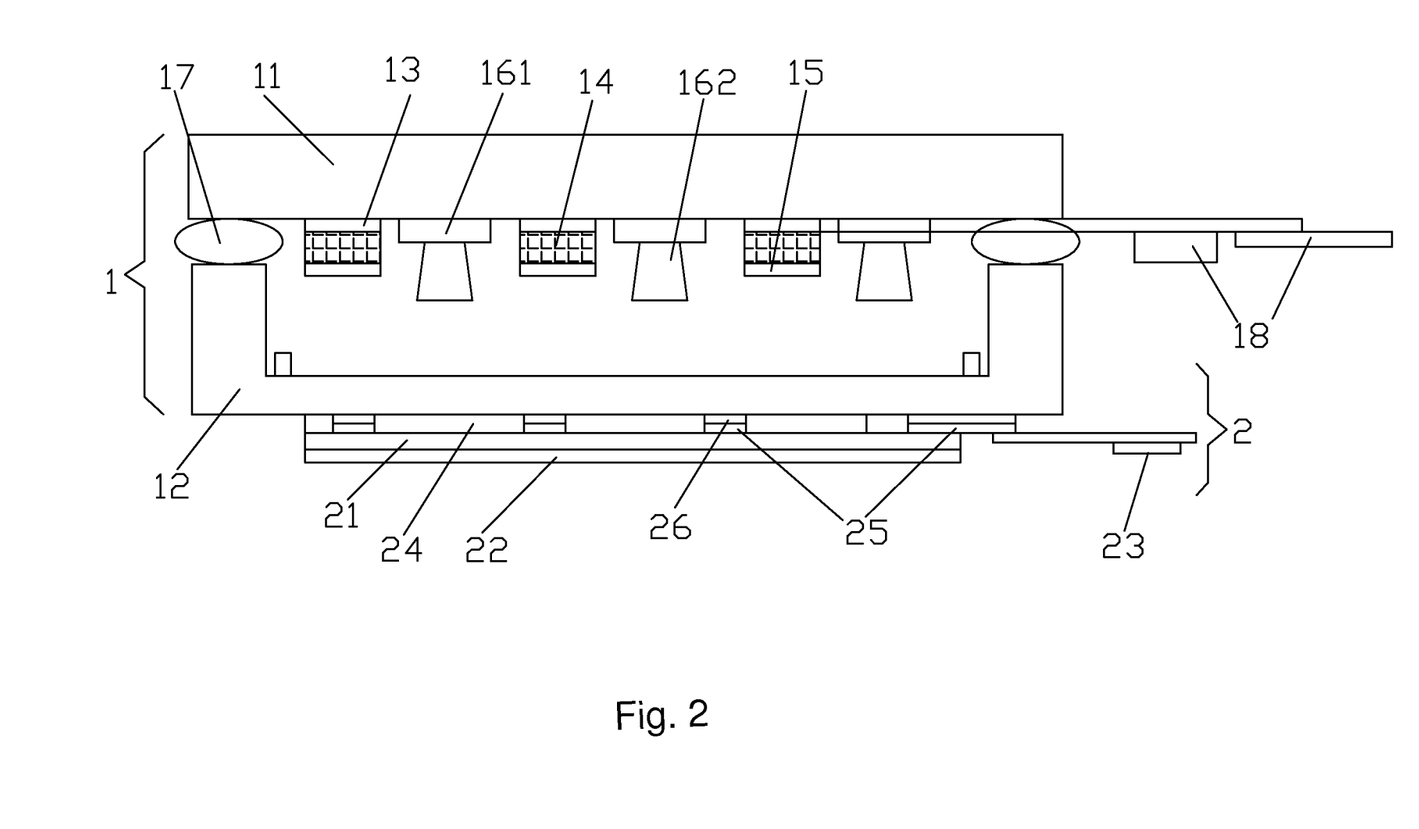
FIG. 2 is a structural diagram of an OLED touch control display device according to the first embodiment of the present invention.
Figure 4:
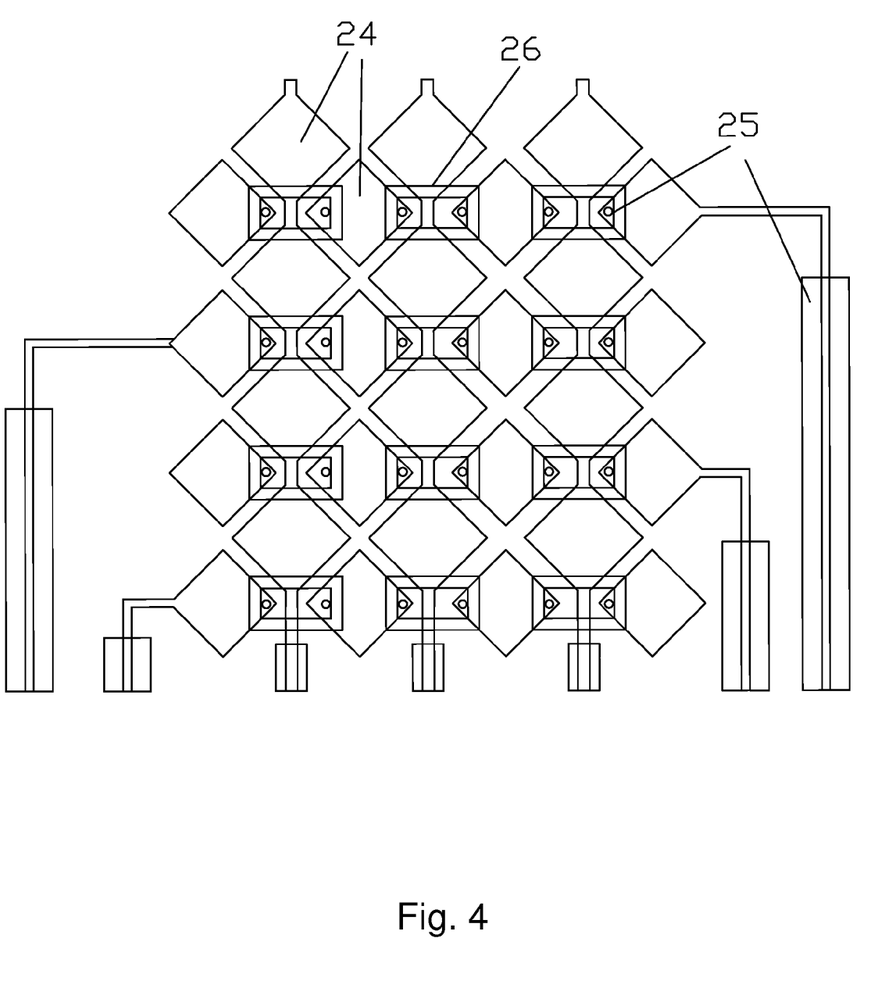
FIG. 4 is a plane structure diagram of an transparent touch panel in the OLED touch control display device according to the present invention.

Please refer to FIG. 2, FIG. 4, which are structural diagrams of an OLED touch control display device according to the first embodiment of the present invention. The OLED touch control display device comprises: an OLED display 1 and a transparent touch panel 2.

The OLED display 1 comprises: a substrate 11, a transparent package cover plate 12 oppositely located with the substrate 11, first electrode layers 13 formed at a side of the substrate 11 facing the transparent package cover plate 12 and arranged in array, an organic emitting light layer 14 and a second electrode layer 15 located on a surface of each first electrode layer 13 away from the substrate 11.

The first electrode layer 13 is a reflective electrode, and the second electrode layer 15 is a transparent electrode. The light of the organic emitting light layer 14 can directly goes out by passing through the second electrode layer 15 or goes out by passing through the second electrode layer 15 after being reflected by the first electrode layer 13, i.e. the OLED display 1 is a top emitting OLED display.

The transparent touch panel 2 is located at the side of the transparent package cover plate 12 of the OLED display 1 backing to the substrate 11. Both the touch panel and the package cover plate are transparent to allow the light passing through the second electrode layer 15 to penetrate the touch panel and the package cover plate. In the first embodiment shown in FIG. 2, the OLED display 1 is a Passive Matrix OLED, and the Passive Matrix OLED further comprises a second insulative layer 161 and an isolation column 162 stacked and located between the two first electrode layers 13 and a display drive circuit 18 electrically connected to the first electrode layers 13. The display drive circuit 18 receives the driving signal of an external control circuit to control voltages between the first and the second electrode layers 13, 15 of the respective pixels in the OLED display 1 to realize display.

The OLED touch control display device further comprises a polarizer 21 located on the transparent touch panel 2 and a scratch resistant transparent hard film 22 located on the polarizer 21; the polarizer 21 is employed to improve the display result, and the scratch resistant transparent hard film 22 is employed to protect the transparent touch panel 2.

As shown in FIG. 4, the transparent touch panel 2 comprises: a transparent electrode conductive layer formed on the transparent package cover plate 2, and the electrode conductive layer comprises at least two unit electrodes 24, a first insulative layer 26 at junctions of the unit electrodes 24, an auxiliary electrode 25 connected to the unit electrode 24 and a touch drive circuit 23 electrically connected to the auxiliary electrode 25.

When the finger closes to the electrode conductive layer, the finger of the user and the electrode conductive layer forms a coupling capacitance due to the human body electric field, and changes the parasitic capacitance of the electrode. The processor acquires the capacitance change values of the respective unit electrodes 24 via the auxiliary electrode 25, and then can analyze the position of the touch point. With the external control circuit electrically connected to the touch drive circuit 23, the following display control can be proceeded.

Figure 3:
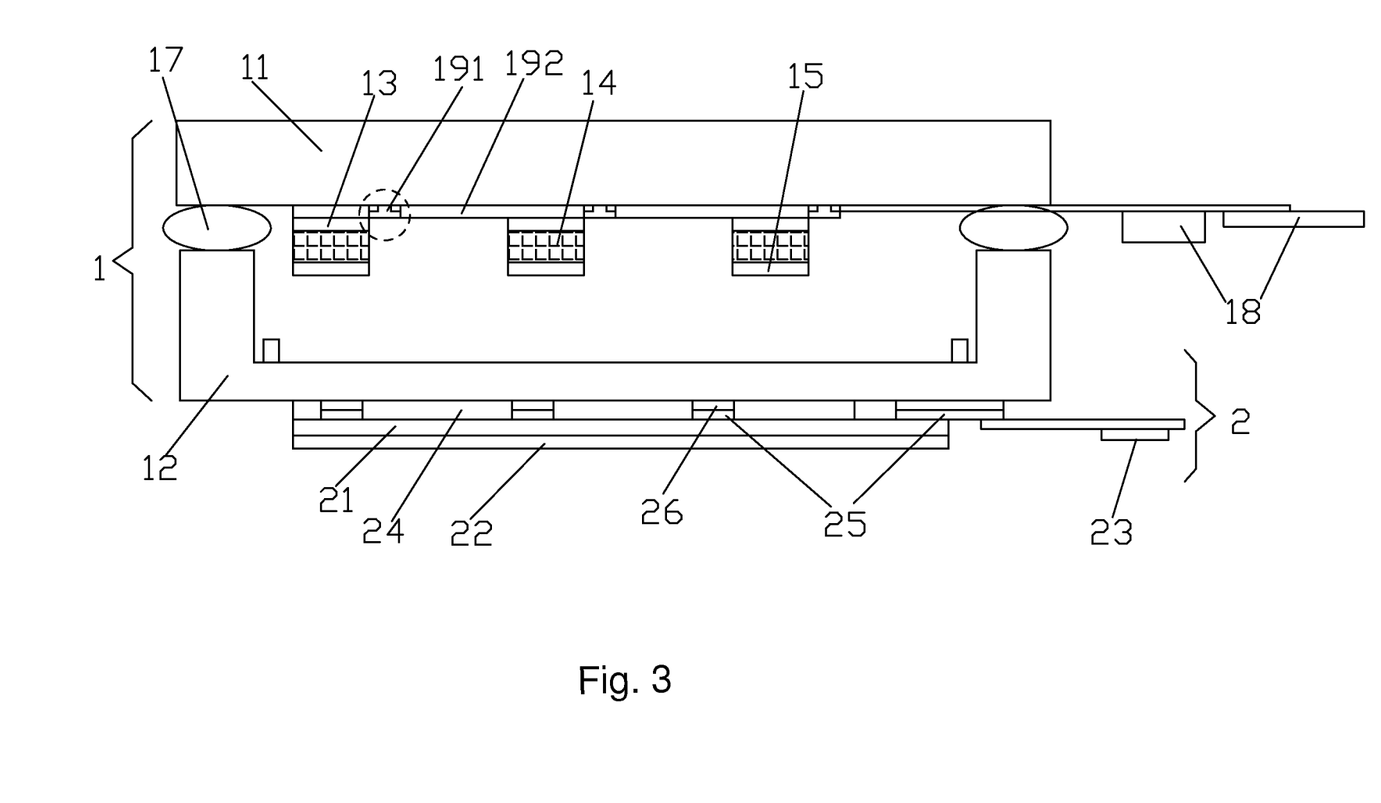
FIG. 3 is a structural diagram of an OLED touch control display device according to the second embodiment of the present invention.

Please refer to FIG. 3, FIG. 4, which are structural diagrams of an OLED touch control display device according to the second embodiment of the present invention. The difference of the second embodiment from the first embodiment is, the OLED display 1 is an Active Matrix OLED, further comprising TFTs 191 located at the side of the substrate 11 facing the transparent package cover plate 12 and arranged in array, and each TFT 191 is connected to one first electrode layer 13, and a third insulative layer 192 is located between two adjacent TFTs 191 and a display drive circuit 18 electrically connected to the TFTs 191. The display drive circuit 18 receives the driving signal of an external control circuit to control on and off of the respective TFTs 191, and the TFT 191 controls the voltage of the corresponding pixel unit to realize display.

The OLED touch control display device of the present invention locates the transparent touch panel 2 at the side of the transparent package cover plate 12 backing to the substrate 11, to make the top emitting OLED possess touch control function, and the all solid state property of the OLED display element is utilized to prevent the influence of the finger touch to the display result; compared with the LCD touch control display device, the thickness of the touch control display device can be diminished and the production cost can be reduced.

Figure 5:
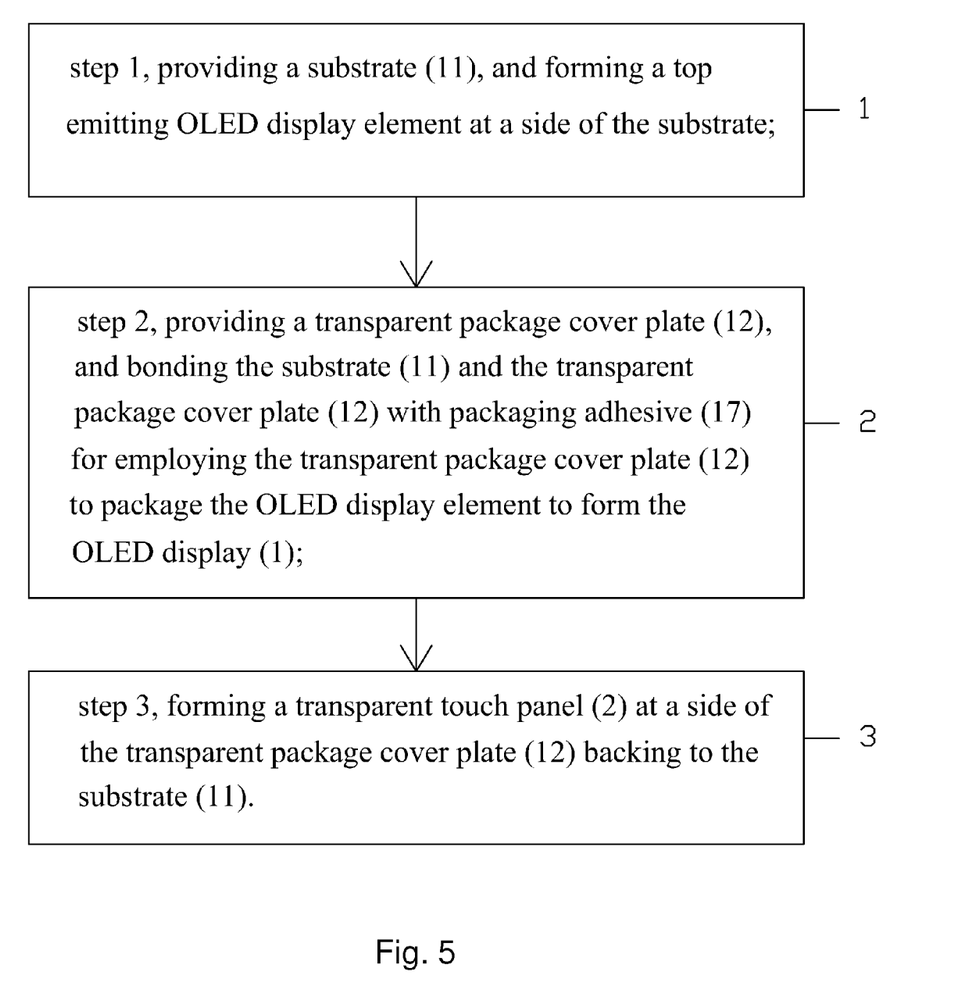
FIG. 5 is a flowchart of a manufacture method of an OLED touch control display device according to the present invention.

Please refer to FIG. 5, in combination with FIG. 2 and FIG. 4, or FIG. 3 and FIG. 4. The present invention further provides a manufacture method of an OLED touch control display device, comprising steps of:

step 1, providing a substrate 11, and forming a top emitting OLED display element at a side of the substrate.

Specifically, as regarding the Passive Matrix OLED shown in FIG. 2, the step 1 comprises: step 11, forming a first electrode layer 13 of the OLED display element at the side of substrate 11, and electrically connecting the first electrode layer 13 and a display driving circuit 18;

the first electrode layer 13 is a reflective electrode;

step 12, forming a second insulative layer 161 and an isolation column 162 stacked between the two first electrode layers 13;

step 13, sequentially forming an organic emitting light layer 14 and a second electrode layer 15 on a surface of each first electrode layer 13 away from the substrate 11;

the second electrode layer 15 is a transparent electrode.

As regarding the Active Matrix OLED shown in FIG. 3, the step 1 comprises: step 11', forming TFTs 191 at the side of the substrate 11 and arranged in array, and forming a third insulative layer 192 between two adjacent TFTs 191 and electrically connecting the TFTs 191 and a display drive circuit 18;

step 12', forming a first electrode layer 13 connected to each TFT 191 at the side of the substrate where the TFTs 191 are arranged in array;

the first electrode layer 13 is a reflective electrode;

step 13', sequentially forming an organic emitting light layer 14 and a second electrode layer 15 on a surface of each first electrode layer 13 away from the substrate 11;

the second electrode layer 15 is a transparent electrode.

step 2, providing a transparent package cover plate 12, and bonding the substrate 11 and the transparent package cover plate 12 with packaging adhesive 17 for employing the transparent package cover plate 12 to package the OLED display element to form the OLED display 1.

step 3, forming a transparent touch panel 2 at a side of the transparent package cover plate 12 backing to the substrate 11.

Specifically, the step 3 comprises:

step 31, forming a transparent electrode conductive layer comprising at least two unit electrodes 24 at the side of the transparent package cover plate 12 backing to the substrate 11;

step 32, forming a first insulative layer 26 at junctions of the unit electrodes 24;

step 33, forming an auxiliary electrode 25 connected to the unit electrode 24 and electrically connecting the auxiliary electrode 25 and a touch drive circuit 23.

The step 3 further comprises: step 34, locating a polarizer 21 on the transparent touch panel 2 and locating a scratch resistant transparent hard film 22 located on the polarizer 21.

The OLED touch control display device manufactured by the aforesaid method is a top emitting OLED and locates the transparent touch panel 2 at the side of the transparent package cover plate 12 backing to the substrate 11, to make the top emitting OLED possess touch control function, and the all solid state property of the OLED display element is utilized to prevent the influence of the finger touch to the display result; compared with the LCD touch control display device, the thickness of the touch control display device can be diminished and the production cost can be reduced.

In conclusion, the OLED touch control display device and the manufacture method thereof according to the present invention sets the first electrode layer close to the substrate to be the reflective electrode and sets the second electrode layer away from the substrate to be the transparent electrode, and locates the transparent touch panel at the side of the transparent package cover plate backing to the substrate, to make the top emitting OLED possess touch control function, and the all solid state property of the OLED display element is utilized to prevent the influence of the finger touch to the display result; compared with the LCD touch control display device, the thickness of the touch control display device can be diminished and the production cost can be reduced.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) touch control display device, comprising: an OLED display and a transparent touch panel;
wherein the OLED display comprises: a substrate, a transparent package cover plate oppositely located on the substrate to define therebetween an internal space, first electrode layers formed on a side of the substrate facing the transparent package cover plate and arranged in array so that the first electrode layers are located in the internal space, and an organic emitting light layer and a second electrode layer located on a surface of each of the first electrode layers away from the substrate such that each of the first electrode layers and the organic emitting light layer and the second electrode layer located on the first electrode layer collectively form an OLED unit that is mounted on the side of the substrate facing the transparent package cover plate;
the first electrode layer is a reflective electrode, and the second electrode layer is a transparent electrode; and
the transparent touch panel is located on a side of the transparent package cover plate of the OLED display that is opposite to the substrate and the transparent touch panel is located externally of the OLED display;
wherien the transparent touch panel comprises: a transparent electrode conductive layer formed on the transparent package cover plate, and the electrode conductive layer comprises at least two unit electrodes, a first insulative layer at junctions of the unit electrodes, an auxiliary electrode connected to the unit electrode and a touch drive circuit electrically connected to the auxiliary electrode such that the at least two unit electrodes are arranged to selectively change capacitance thereof for detection of a location of an external object approaching the electrode conductive layer; and
wherein the OLED display comprises an isolation column that is mounted to the side of the substrate facing the transparent package cover plate and is arranged between every two adjacent ones of the OLED units.

2. The OLED touch control display device according to claim 1, wherein the OLED display is a Passive Matrix OLED, and the Passive Matrix OLED further comprises a second insulative layer that is mounted between the side of the substrate facing the transparent packaging cover plate and the isolation column and a display drive circuit electrically connected to the first electrode layers.

3. The OLED touch control display device according to claim 1, further comprising a polarizer located on the transparent touch panel and a scratch resistant transparent hard film located on the polarizer.

4. A manufacture method of an organic light emitting diode (OLED) touch control display device, comprising steps of:
step 1, providing a substrate, and forming a top emitting OLED display element on a side of the substrate;
step 2, providing a transparent package cover plate, and bonding the transparent package cover plate to the side of the substrate with packaging adhesive so as to define an internal space between the substrate and the transparent package cover plate with the top emitting OLED display being located in the internal space, such that the transparent package cover plate encloses and thus packages the top emitting OLED display element to form an OLED display; and
step 3, forming a transparent touch panel on a side of the transparent package cover plate that is opposite to the substrate such that the transparent touch panel is located externally of the OLED display;
wherein step 1 comprises:
step 11, forming first electrode layers of the OLED display element on the side of the substrate, and electrically connecting the first electrode layers to a display driving circuit;
wherein the first electrode layers are each a reflective electrode;
step 12, forming a second insulative layer and an isolation column that are stacked on each other and located between every two adjacent ones of the first electrode layers; and
step 13, sequentially forming an organic emitting light layer and a second electrode layer on a surface of each of the first electrode layers away from the substrate such that each of the first electrode layers and the organic emitting light layer and the second electrode layer located on the first electrode layer collectively form an OLED unit that is mounted on the side of the substrate facing the transparent package cover plate;
wherein the second electrode layer is a transparent electrode;
wherein the isolation column that is stacked on the second insulation layer is arranged between every two adjacent ones of the OLED units; and
wherein step 3 comprises:
step 31, forming a transparent electrode conductive layer comprising at least two unit electrodes on the side of the transparent package cover plate that is opposite to the substrate;
step 32, forming a first insulative layer at junctions of the unit electrodes; and
step 33, forming an auxiliary electrode connected to the unit electrodes and electrically connecting the auxiliary electrode to a touch drive circuit;
wherein the at least two unit electrodes are arranged to selectively change capacitance thereof for detection of a location of an external object approaching the electrode conductive layer.

5. The manufacture method of the OLED touch control display according to claim 4, wherein step 3 further comprises: step 34, mounting a polarizer on the transparent touch panel and mounting a scratch resistant transparent hard film on the polarizer.

6. An organic light emitting diode (OLED) touch control display device, comprising: an OLED display and a transparent touch panel;
wherein the OLED display comprises: a substrate, a transparent package cover plate oppositely located on the substrate to define therebetween an internal space, first electrode layers formed on a side of the substrate facing the transparent package cover plate and arranged in array so that the first electrode layers are located in the internal space, and an organic emitting light layer and a second electrode layer located on a surface of each of the first electrode layers away from the substrate such that each of the first electrode layers and the organic emitting light layer and the second electrode layer located on the first electrode layer collectively form an OLED unit that is mounted on the side of the substrate facing the transparent package cover plate;

the first electrode layer is a reflective electrode, and the second electrode layer is a transparent electrode; and the transparent touch panel is located on a side of the transparent package cover plate of the OLED display that is opposite to the substrate and the transparent touch panel is located externally of the OLED display;

wherein the transparent touch panel comprises: a transparent electrode conductive layer formed on the transparent package cover plate, and the electrode conductive layer comprises at least two unit electrodes, a first insulative layer at junctions of the unit electrodes, an auxiliary electrode connected to the unit electrode and a touch drive circuit electrically connected to the auxiliary electrode such that the at least two unit electrodes are arranged to selectively change capacitance thereof for detection of a location of an external object approaching the electrode conductive layer; and wherein the OLED display is a Passive Matrix OLED, and the Passive Matrix OLED further comprises a second insulative layer and an isolation column stacked on the second insulative layer and located between the two first electrode layers and a display drive circuit electrically connected to the first electrode layers, wherein the isolation column that is stacked on the second insulation layer is arranged between every two adjacent ones of the OLED units.

7. The OLED touch control display device according to claim 6, further comprising a polarizer located on the transparent touch panel and a scratch resistant transparent hard film located on the polarizer.

* * * * *